United States Patent [19]

Maggio

[11] Patent Number: 5,834,084
[45] Date of Patent: Nov. 10, 1998

[54] DISC DRIVE FLEX ASSEMBLY HAVING A LOW PARTICULATING CIRCUIT BOARD

[75] Inventor: Mark S. Maggio, Phoenix, Ariz.

[73] Assignee: Seagate Technology, Inc., Scotts Valley, Calif.

[21] Appl. No.: 869,567

[22] Filed: Jun. 5, 1997

Related U.S. Application Data

[60] Provisional application No. 60/020,323 Jun. 25, 1996.
[51] Int. Cl.⁶ .............................. G11B 33/14; B32B 3/02
[52] U.S. Cl. .................. 428/64.1; 428/64.3; 428/65.3; 428/65.9; 428/209; 428/413; 428/416; 428/418; 428/901; 360/97.01; 360/98.07; 360/99.01; 360/99.04; 360/99.08; 360/99.09; 360/99.11; 360/99.12; 29/825; 29/829; 29/830; 29/831; 29/834; 29/835; 29/836; 29/841; 29/846; 29/847; 29/855; 29/857
[58] Field of Search ............................. 360/97.01, 98.07, 360/99.01, 99.04, 99.08, 99.09, 99.11, 99.12; 428/209, 64.1, 413, 64.3, 416, 65.3, 418, 65.9, 901; 29/825, 829, 830, 831, 834, 835, 836, 841, 846, 847, 855, 857

[56] References Cited

U.S. PATENT DOCUMENTS 5,025,336  6/1991  Morehouse et al. ................. 360/97.02

*Primary Examiner*—Frederick Krass
*Attorney, Agent, or Firm*—Bill D. McCarthy; Edward P. Heller, III; Randall K. McCarthy

[57] ABSTRACT

A low particulating circuit board for a disc drive flex assembly, and a method for forming the same, are disclosed. The circuit board comprises a conductive metal substrate which has sufficient thickness to provide mechanical support and backplane suppression for the circuit board and to efficiently sink heat generated by preamplifier circuitry housed by the circuit board. The substrate has dielectric layers formed on the top and bottom surfaces thereof, the dielectric layers comprising an epoxy interleaved with non-particulating fibers, such as tetrafluorethylene (TFE) fibers. Traces and pads are provided on the dielectric layers to provide the necessary electrical connections for the preamplifier circuitry. A plurality of circuit boards are formed from a panel and subsequently cut therefrom. Particulate generation is minimized through the use of the metal substrate, as well as recession of the substrate and the solder masks to reduce the amount of material cut during the cutting operation.

20 Claims, 9 Drawing Sheets

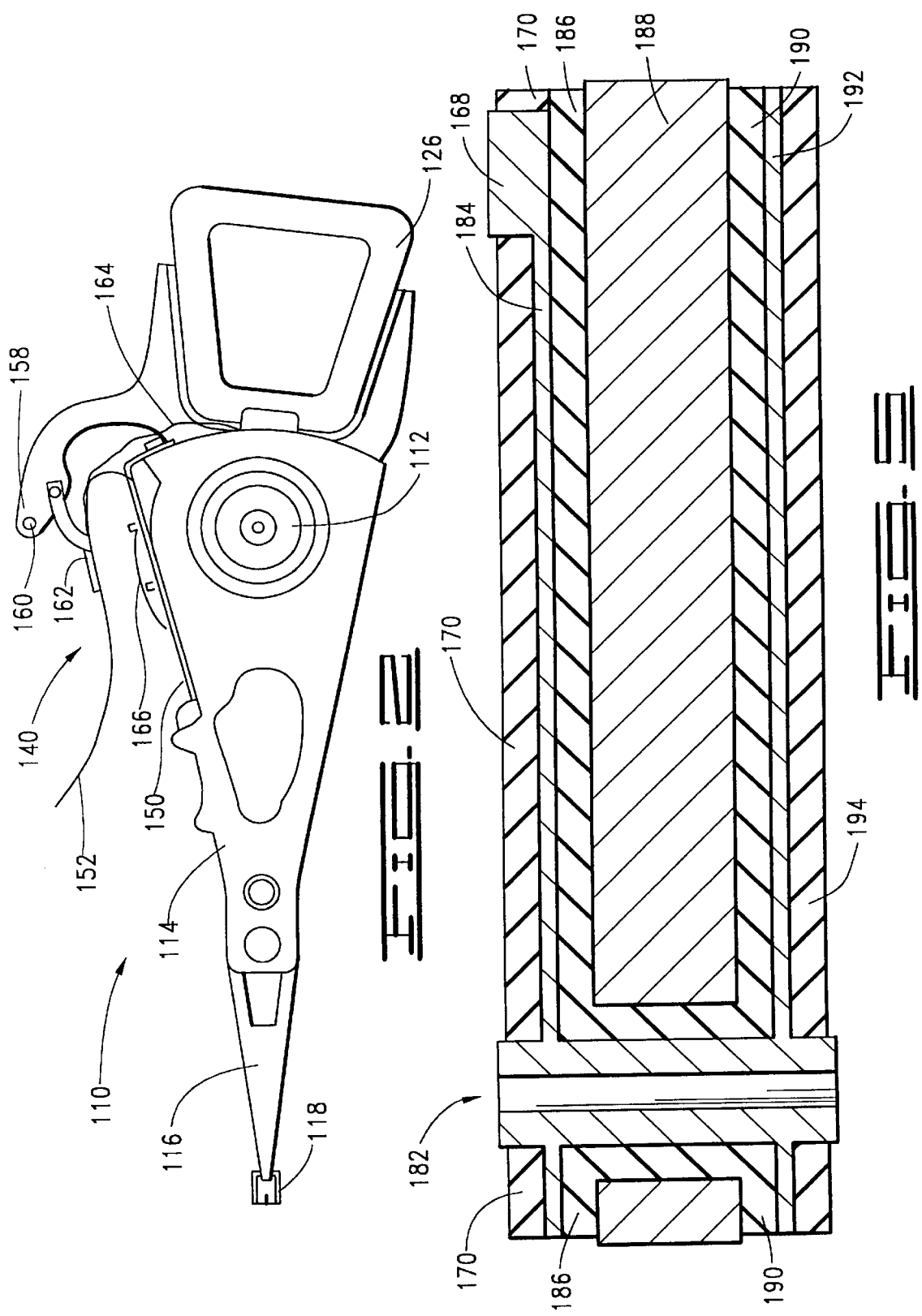

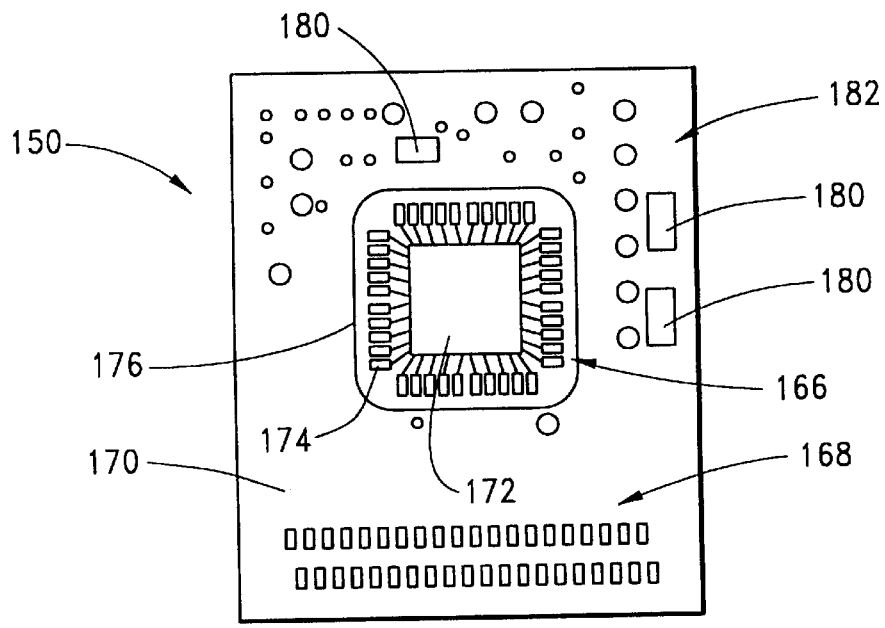
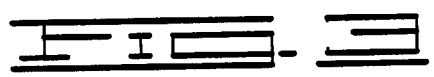
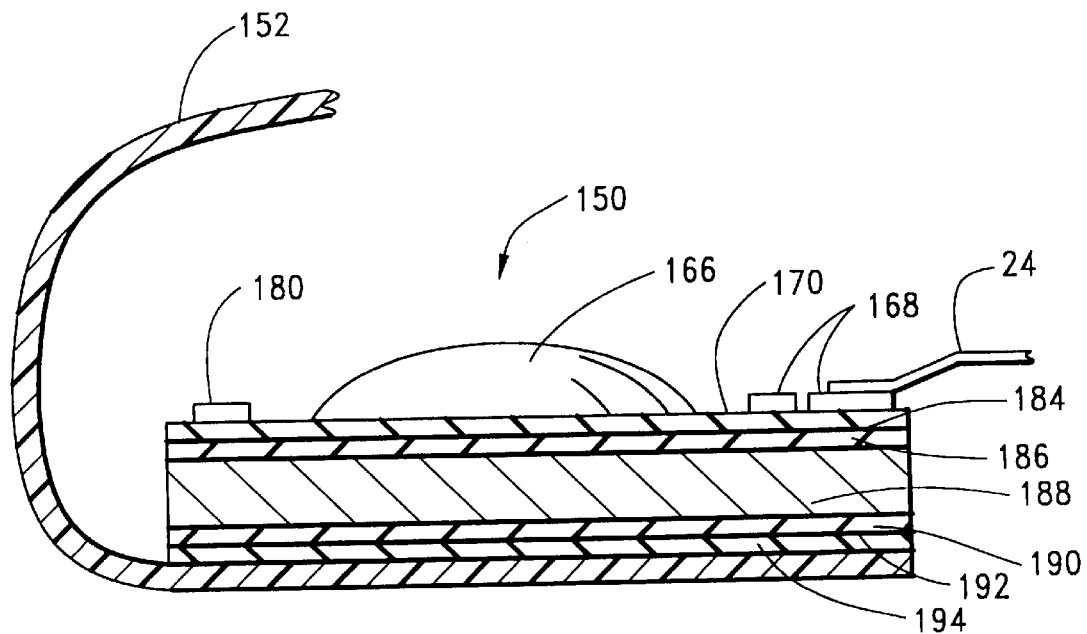
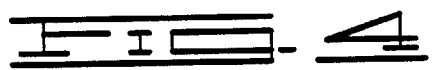

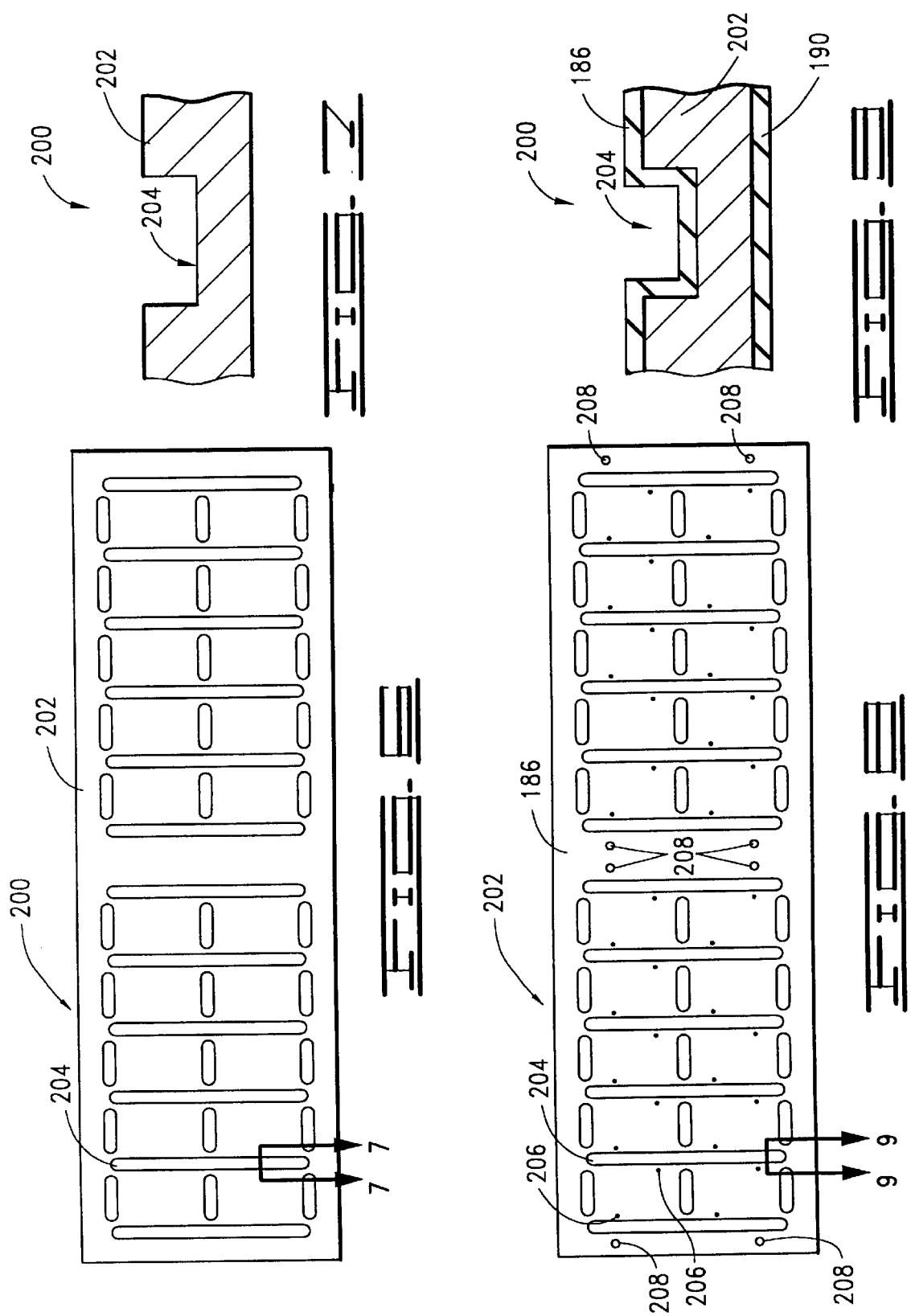

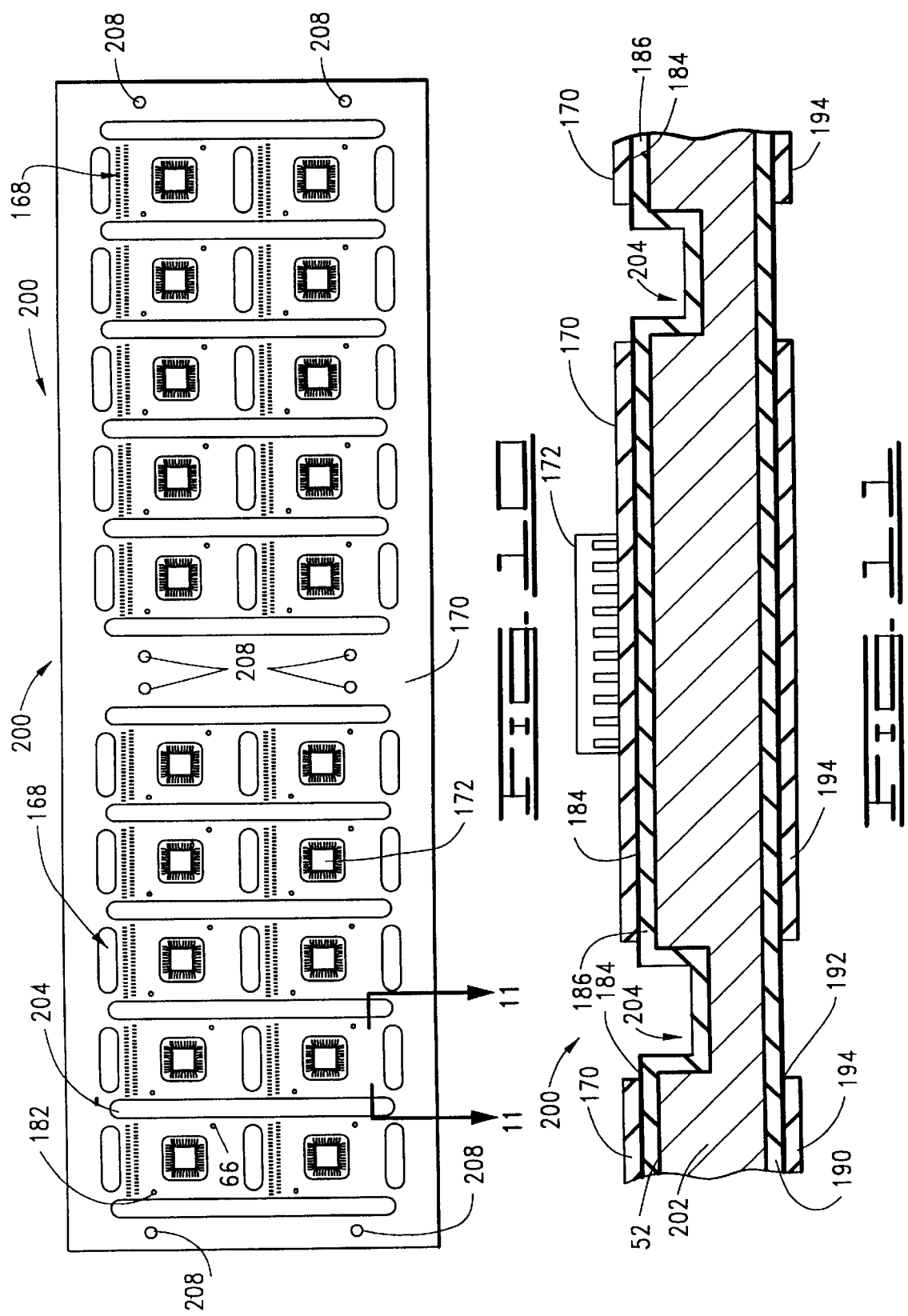

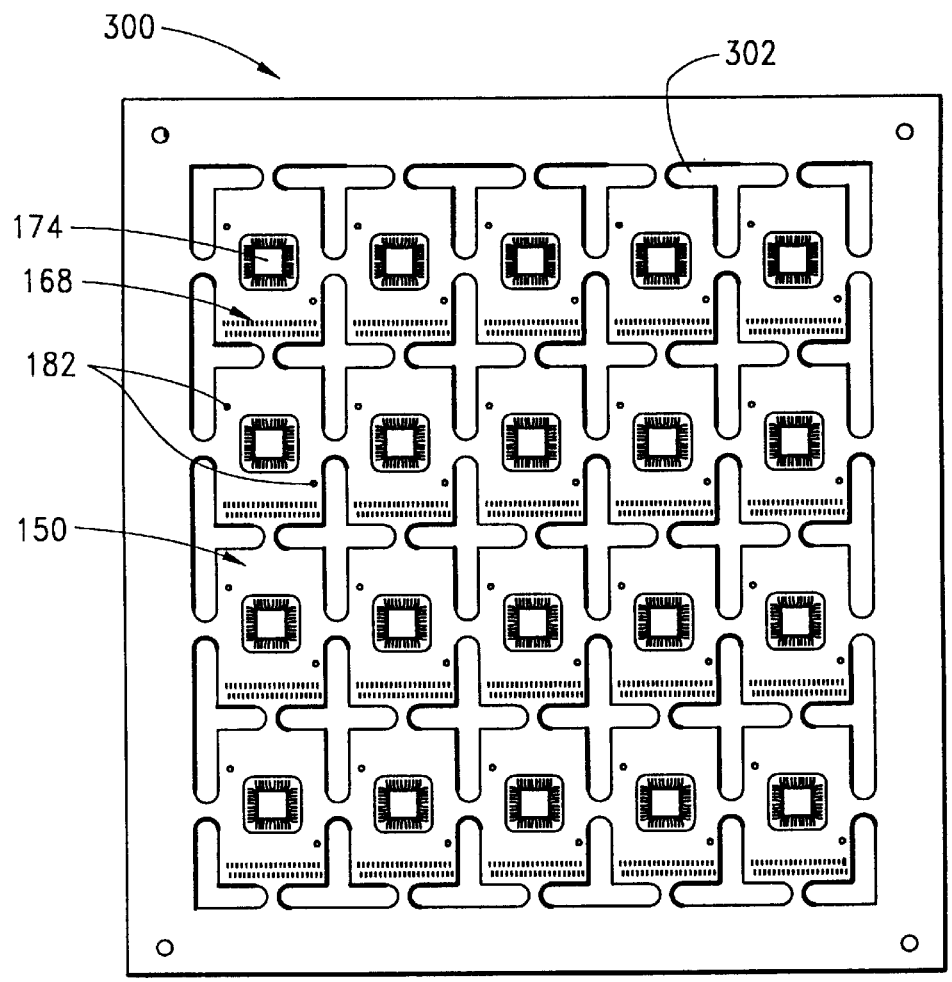
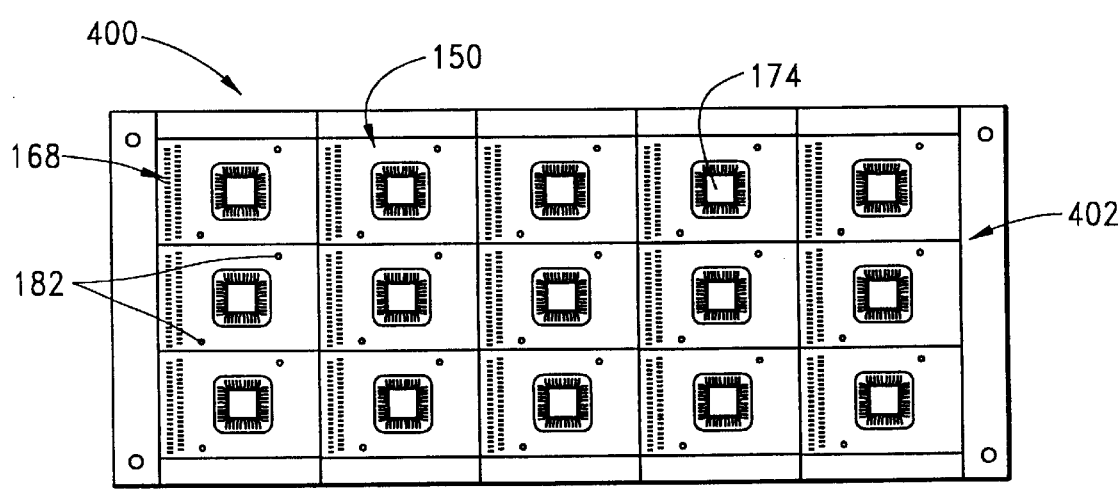
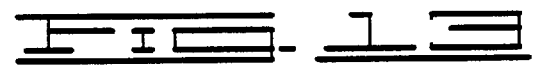

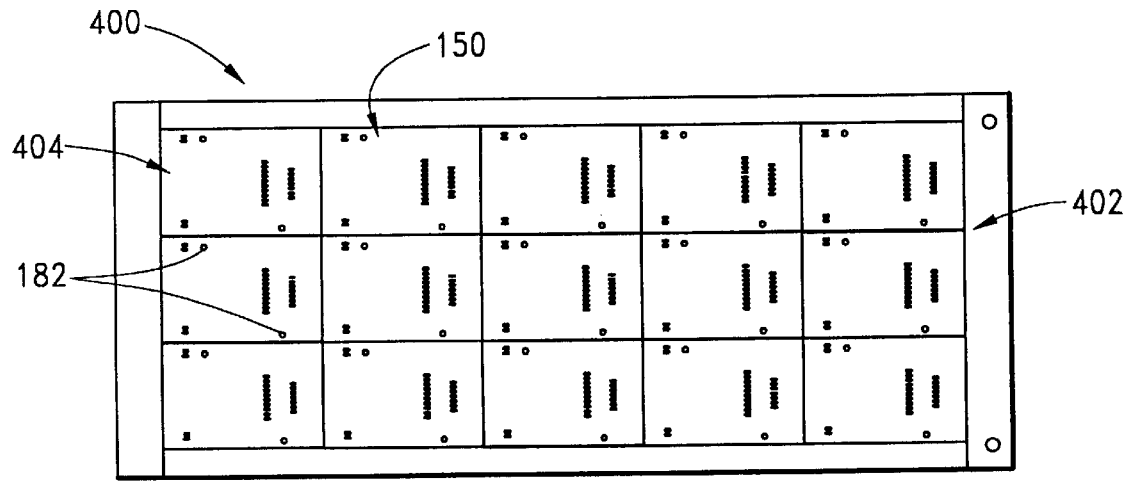
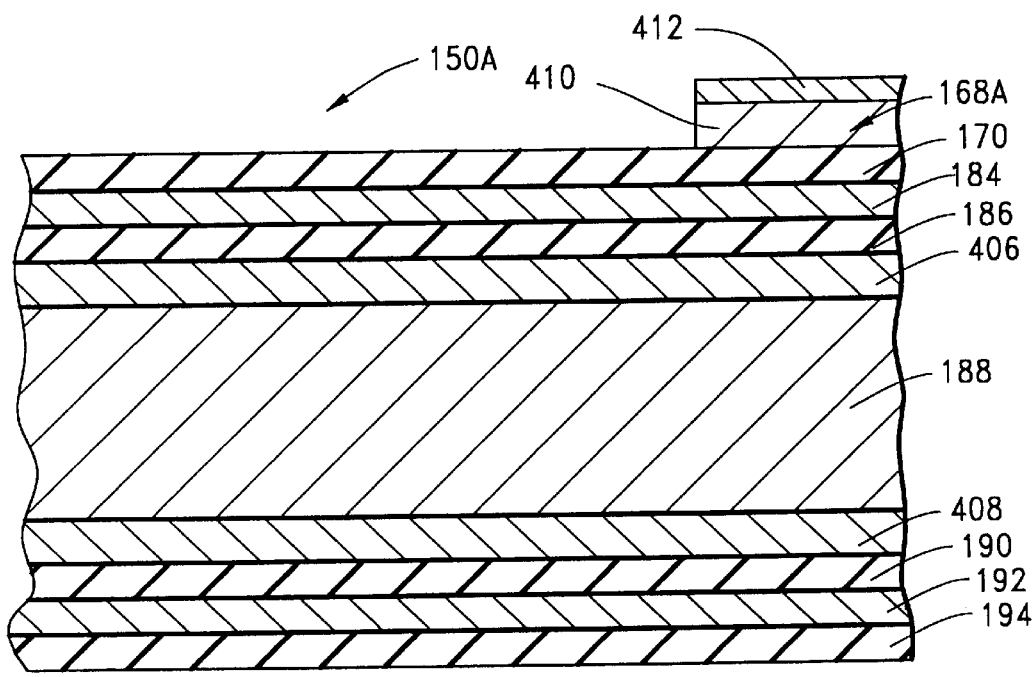

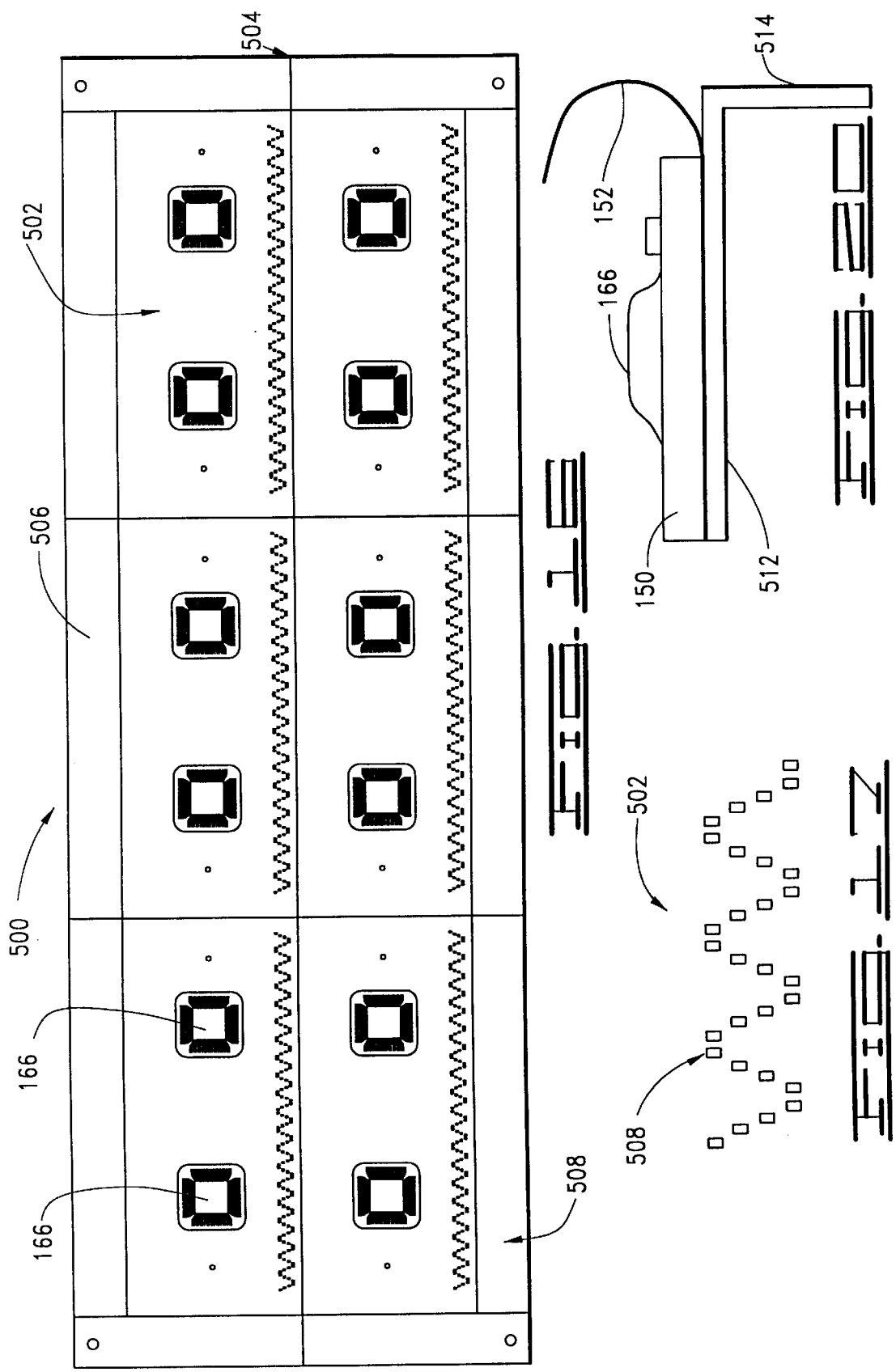

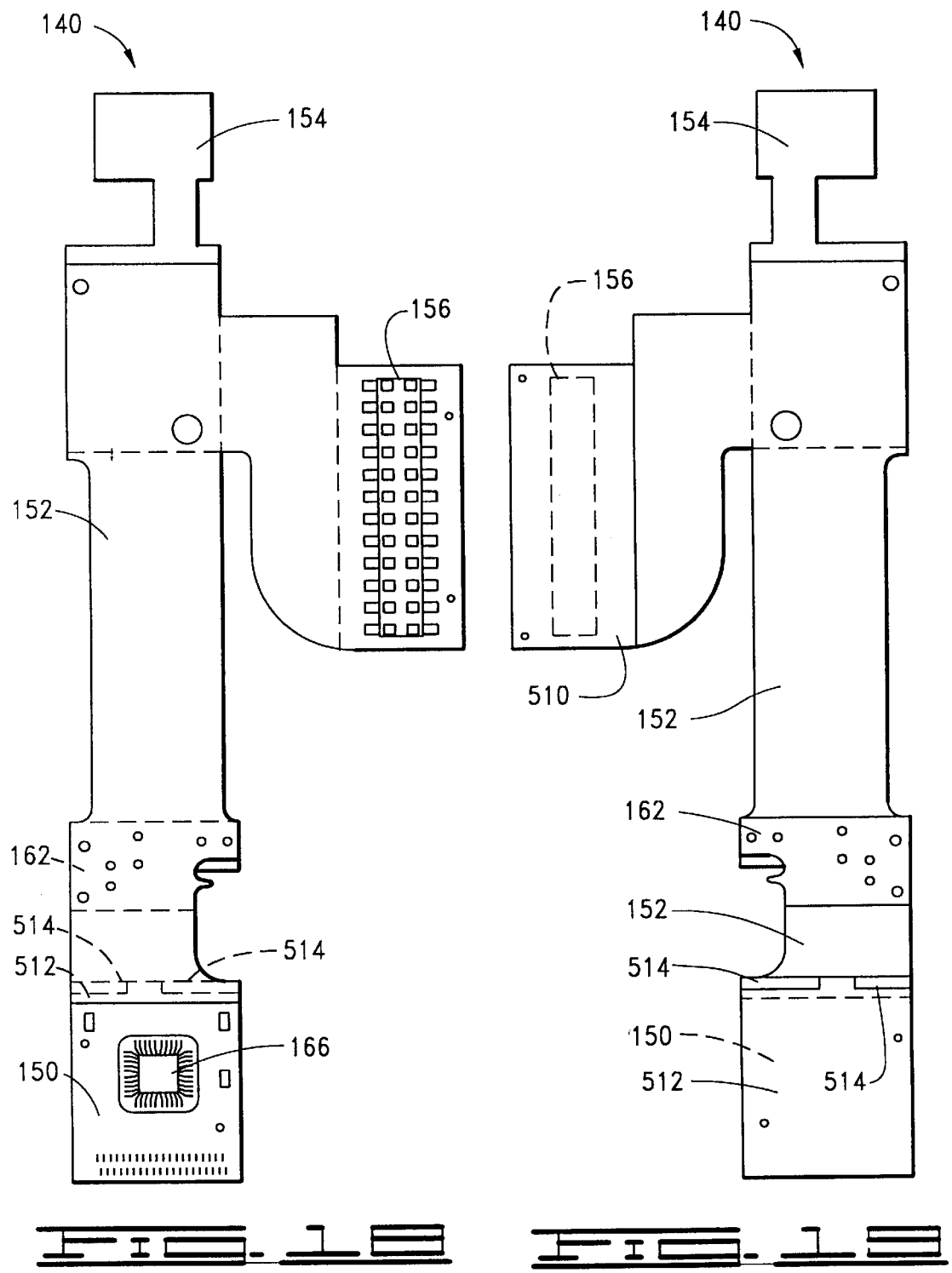

DISC DRIVE FLEX ASSEMBLY HAVING A LOW PARTICULATING CIRCUIT BOARD

CROSS-REFERENCE TO RELATED APPLICATIONS

This application claims priority to U.S. Provisional Application No. 60/020,323 filed Jun. 25, 1996.

FIELD OF THE INVENTION

This invention relates generally to the field of disc drive data storage devices, and more particularly, but not by way of limitation, to an improved flex assembly having a low particulating circuit board suitable for use within the internal environment of a disc drive.

BACKGROUND

Modern hard disc drives comprise one or more rigid discs that are coated with a magnetizable medium and mounted on the hub of a spindle motor for rotation at a constant high speed. Information is stored on the discs in a plurality of concentric circular tracks by an array of transducers ("heads") mounted to a radial actuator for movement of the heads relative to the discs.

Typically, such radial actuators employ a voice coil motor to position the heads with respect to the disc surfaces. The heads are mounted via flexures at the ends of a plurality of arms which project radially outward from a substantially cylindrical actuator body. The actuator body pivots about a bearing assembly mounted to the disc drive housing at a position closely adjacent the outer extreme of the discs. The bearing assembly is parallel with the axis of rotation of the spindle motor and the discs, so that the heads move in a plane parallel with the surfaces of the discs.

The actuator voice coil motor includes a coil mounted on the side of the actuator body opposite the head arms so as to be immersed in the magnetic field of an array of permanent magnets. When current is passed through the coil, an electromagnetic field is set up which interacts with the magnetic field of the permanent magnets and causes the coil to move relative to the permanent magnets in accordance with the well-known Lorentz relationship. As the coil moves relative to the permanent magnets, the actuator body pivots about the pivot shaft and the heads are moved across the disc surfaces.

Typically, the heads are supported over the discs by actuator slider assemblies which include air-bearing surfaces designed to interact with a thin layer of moving air generated by the rotation of the discs, so that the heads are said to "fly" over the disc surfaces. Generally, the heads write data to a selected data track on the disc surface by selectively magnetizing portions of the data track through the application of a time-varying write current to the head. In order to subsequently read back the data stored on the data track, the head detects flux transitions in the magnetic fields of the data track and converts these to a signal which is decoded by read channel circuitry of the disc drive. Electrical connections between the heads and the disc drive electronic circuitry are typically accomplished through the use of a flex circuit which attaches to the rotary actuator assembly.

Of the variety of head constructions presently used in modern disc drives, magneto-resistive heads (hereinafter "MR heads") are of particular interest. MR heads include the use of a thin film element which has the characteristic of having a changed resistance in the presence of a magnetic field of a predetermined orientation. Taking advantage of this characteristic, an MR head generally performs a read operation by passing a bias current through this thin film element and detecting changes in the bias current as a result of exposure of the thin film element to the flux transitions from the data track (as the resistance of the thin film element is changed thereby). These changes in the bias current are subsequently decoded by the read channel in order to reconstruct the data that was previously stored on the track. Generally, the MR head writes data to the track using an inductive writing technique, whereby a write current of a selected magnitude and polarity is passed through the head in order to selectively magnetize portions of the data track.

Typically, an MR head has two pairs of electrical connections, one pair for the write element portion of the head and one pair for the read element portion of the head, with each pair of connections comprising a current source and a current return path. Thus, during a read operation, one pair of the connections is used to pass the read bias current through the thin film element of the MR head and time-varying changes in the read bias current are detected by sense circuitry; during a write operation, the other pair of connections is used to provide the write current to the head in order to selectively magnetize the data track.

It is well known that the utilization of MR heads has led to further improvements in data storage capabilities of modern disc drives, in that increased areal densities (that is, the number of storage elements per square unit of disc surface, presently exceeding one gigabit per square inch) have been achieved partially in response to the use of such MR heads. As market forces continue to provide economic incentive for pushing the areal density design envelope, it is increasingly desirable to optimize the performance of MR heads in new disc drives.

However, the use of MR heads requires significant increases in the complexity of the circuitry used to control the read and write operations of the heads. Particularly, MR heads typically require low impedance preamplifiers having responses that vary in relation to the lead lengths between the preamplifier and the heads. As a result, the preamplifier circuitry is desirably placed as close to the MR heads as possible.

Prior art approaches have incorporated the MR head circuitry into the flex circuit using chip on flex (direct attachment of the circuitry to the flex) and chip on ceramic (encapsulating the circuitry in a ceramic package which is attached to the flex). However, these and other methodologies have resulted in certain drawbacks related to cost, manufacturability and, for the chip on ceramic approach, solder reflowability. As will be recognized, it would be desirable to use conventional printed circuit board (PCB) approaches wherein a PCB is attached to the flex circuit to house and connect the circuitry; however, the use of PCBs raises problems due to particulate contamination of the internal environment of the disc drive. Particularly, as will be recognized PCBs include a fiberglass/epoxy substrate which, when cut, releases particulate contamination in the form of glass fibers which can adversely affect the performance of the disc drive.

Additionally, the circuitry used by MR heads uses a significant amount of power, requiring a need to efficiently dissipate heat generated by the circuitry.

There is a need, therefore, for an improved approach to providing the circuitry used by the heads in a disc drive on the flex circuit which does not generate particulate contamination associated with PCBs and which overcomes the drawbacks related to the chip on flex and chip on ceramic approaches.

SUMMARY OF THE INVENTION

The present invention provides an improved flex assembly having a low particulating circuit board, the circuit board housing read signal preamplifier circuitry and providing the necessary interconnections between the heads and the rest of the disc drive electronics.

In accordance with the preferred embodiment, the circuit board comprises a solid metal substrate, preferably copper, having dielectric layers formed on the top and bottom surfaces thereof. The dielectric layers comprise an epoxy interleaved with nonparticulating fibers. Connection paths (traces) and pads are provided on the dielectric layer to provide the necessary electrical connections for the preamplifier circuitry attached to the circuit board. Plated-through-hole connections (vias) are provided through the board to facilitate connection of the board to a flex ribbon of a flex assembly used to provide communication between the board and a disc drive printed circuit board (PCB) mounted to the bottom of the disc drive.

The circuit board is preferably fabricated using a method comprising the steps of providing a substrate through which connection holes are drilled or chemically etched. The top and bottom surfaces of the substrate are coated with a layer of dielectric, which is preferably epoxy interleaved with tetrafluorethylene (TFE) fibers. The characteristics of the dielectric layer facilitate proper coating of the top and bottom surfaces of the copper substrate, as well as the inner surfaces of the connection holes. In alternative embodiments, additional layers of nickel and palladium are provided to improve the manufacturability of the board.

Suitable masking and plating operations are performed to form the necessary traces and pads for the circuitry as well as plated through holes (at the connection holes) to provide the necessary connections between the top and the bottom sides of the board. The preamplifier circuitry is provided in the form of an integrated circuit that is glued down to the top surface of the circuit board and then wire bonded to corresponding pads, after which the integrated circuit and connections are encapsulated in epoxy. Additional discrete components are soldered to the circuit board as required and the board is thereafter attached to the flex assembly and incorporated into the disc drive.

Preferably, a plurality of circuit boards are formed from a composite panel and are subsequently detached therefrom using a diamond saw or other suitable cutting instrument. Recession of the substrate and the solder masks away from the cutting paths on the panel reduces particulate generation during the cutting operation and leaves the edges of the solder masks undisturbed; likewise, the interleaved epoxy possesses excellent nonparticulating characteristics, further reducing particulate generation during disc drive operation.

Moreover, the thickness of the substrate is selected to allow adequate coating of the inside of the connection holes by the dielectric, while still retaining sufficient mass and structural integrity to support the board and to serve as an efficient heat sink for the heat generated by the preamplifier circuitry during operation of the disc drive. The substrate also provides backplane suppression for the preamplifier circuitry.

These and various other features as well as advantages which characterize the present invention will be apparent from a reading of the following detailed description and a review of the associated drawings.

BRIEF DESCRIPTION OF THE DRAWINGS

FIG. 2 provides a top plan view of an actuator assembly of FIG. 1, including a circuit board constructed in accordance with the preferred embodiment of the present invention.

FIG. 3 is a top plan view of the circuit board of FIGS. 1–2.

FIG. 4 is a cross-sectional, side elevational view of the circuit board of FIGS. 1–3 in conjunction with a portion of the flex shown in FIG. 1.

FIG. 5 is a cross-sectional, side elevational view of the circuit board of FIGS. 1–4, providing additional detail with regard to the plated through holes and pads of the circuit board.

FIG. 6 provides a top plan view of a copper plate of a panel from which a plurality of the circuit boards of FIGS. 1–5 can be advantageously formed.

FIG. 7 provides a cross-sectional, elevational view of a selected portion of FIG. 6 as indicated by line 7—7 in FIG. 6.

FIG. 8 shows the panel of FIG. 6 with selected connection holes drilled or etched through the plate and layers of dielectric selectively formed on the top and bottom surfaces of the plate.

FIG. 9 provides a cross-sectional, elevational view of a selected portion of FIG. 8 as indicated by line 9—9 in FIG. 8.

FIG. 10 illustrates the panel of FIG. 8 after additional process steps have been applied thereto, including the formation of traces on the dielectric layers, the application of a solder mask over the traces, the formation of pads and plated through holes and the bonding of preamplifier integrated circuits to selected pads.

FIG. 11 provides a cross-sectional, elevational view of a selected portion of FIG. 10 as indicated by line 11—11 in FIG. 10.

FIG. 12 provides a top plan view of an alternative panel to the panel of FIGS. 6–11, the panel of FIG. 12 comprising a total of 25 of the boards of FIGS. 1–5.

FIG. 13 provides a top plan view of another alternative panel to the panels of FIGS. 6–11 and the panel of FIG. 12. The panel of FIG. 13 comprises a total of 15 of the boards of FIGS. 1–5.

FIG. 14 provides a bottom plan view of the panel of FIG. 13.

FIG. 15 provides a cross-sectional, elevational view of an alternative embodiment that is similar in construction to the board of FIGS. 1–5.

FIG. 16 provides a top plan view of an alternative panel to the panels of FIGS. 6–11, 12, and 13–14. The panel of 16 comprises a total of six boards that are generally similar in construction to the board of FIGS. 1–5, with exceptions including the use of two integrated circuits and a v-shaped configuration for the head lead wire pads in order to accommodate a relatively large number of heads.

FIG. 17 shows a portion of the v-shaped pad configuration in greater detail.

FIGS. 18 and 19 provide top and bottom plan views, respectively, of the flex assembly of FIG. 1. FIG. 20 provides a side elevational view of a portion of the flex assembly of FIGS. 1 and 18–19.

DETAILED DESCRIPTION

Figure 1:
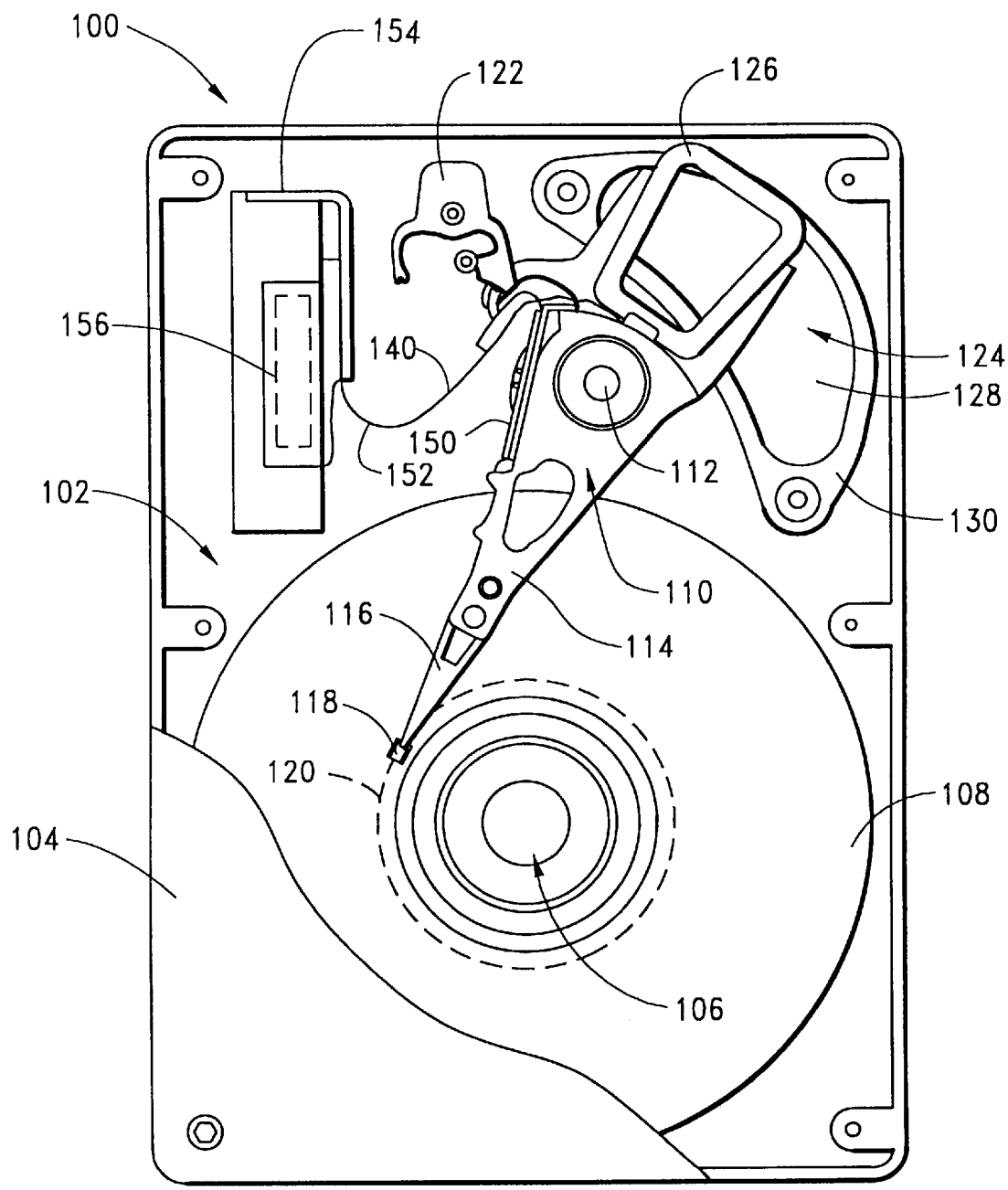
FIG. 1 provides a top plan view of a disc drive constructed in accordance with the preferred embodiment of the present invention.

Turning now to the drawings and more particularly to FIG. 1, shown therein is a top plan view of a disc drive 100 constructed in accordance with the preferred embodiment of the present invention. The disc drive 100 includes a base deck 102 to which various components of the disc drive 100 are mounted. A top cover 104 (shown in partial cutaway fashion) cooperates with the base deck 102 in a known manner to form a sealed internal environment for the disc drive.

A spindle motor (shown generally at 106) rotates one or more discs 108 at a constant high speed. Information is written to and read from tracks (not designated) on the discs 108 through the use of an actuator assembly 110, which rotates about a cartridge bearing assembly 112 positioned adjacent the discs 108.

The actuator assembly 110 includes a plurality of actuator arms 114 which extend towards the discs 108, with one or more flexures 116 extending from each of the actuator arms 114. Mounted at the distal end of each of the flexures 116 is a head 118 which includes a slider assembly (not separately designated) having associated aerodynamic characteristics to enable the head 118 to fly in close proximity to the corresponding surface of the associated disc 108. For purposes of disclosure the head 118 is contemplated as comprising an MR head, although it will be recognized that the present invention is not so limited.

At such time that the disc drive 100 is not in use, the heads 118 are moved over landing zones 120 near the inner diameter of the discs 108. The heads 118 are secured over the landing zones 120 through the use of a conventional latch arrangement, such as designated at 122, which prevents inadvertent rotation of the actuator assembly 110 when the heads are parked.

The radial position of the heads 118 is controlled through the use of a voice coil motor (VCM) 124, which as will be recognized typically includes a coil 126 attached to the actuator assembly 110, as well as one or more permanent magnets 128 and corresponding magnetically permeable pole-pieces 130 which establish a magnetic field in which the coil 126 is immersed. Thus, the controlled application of current to the coil 126 causes magnetic interaction between the magnetic field of the VCM 124 and electromagnetic fields induced in the coil 126 so that the coil 126 moves in accordance with the well known Lorentz relationship. As the coil 126 moves, the actuator assembly 110 pivots about the cartridge bearing assembly 112 and the heads 118 are caused to move across the surfaces of the discs 108.

A flex assembly 140 provides the requisite electrical connection paths for the actuator assembly 110 while facilitating pivotal movement of the actuator assembly 110 during operation. The flex assembly includes a printed circuit board 150 (hereinafter also referred to as "PCB" and "board") to which head wires (not shown) are connected, the head wires being routed along the actuator arms 114 and the flexures 116 to the heads 118. The board 150 includes circuitry for controlling the write currents applied to the heads 118 during a write operation and for amplifying read signals generated by the heads 118 during a read operation. As shown in FIG. 1, the flex assembly further includes a flex 152 to which the board 150 is affixed, the flex 152 comprising a laminated plastic ribbon having encapsulated signal paths. The flex 152 mechanically terminates at a termination bracket 154 that mechanically secures the flex 152 relative to the base deck 102. Moreover, the flex 152 electrically terminates at a flex connector 156 (shown extending downwardly in broken line fashion) which mates with a corresponding, upwardly extending connector (not separately shown) of a disc drive printed circuit board (PCB) mounted to the bottom side of the disc drive 100. The upwardly extending connector from the PCB extends through an opening in the base deck 102 in a conventional manner.

Referring now to FIG. 2, shown therein is the actuator assembly 110 of FIG. 1 in greater detail. A support arm 158 extends from the actuator assembly 110 as shown to facilitate the latching of the actuator assembly 110 through mechanical interaction of the latch 122 (FIG. 1) with a latch pin 160. The support arm 158 further supports a flex bracket 162 of the flex assembly 140 that secures the flex 152 relative to the board 150 and facilitates the attachment of coil wires 164 to the flex 152.

The board 150 is further shown in FIG. 2 to include a preamplifier circuit 166 which generally provides the read bias currents and preamplification of detected read signals necessary during a read operation, as well as the generation of write currents used to write data during a write operation. The preamplifier circuit 166 preferably comprises an integrated circuit which is affixed to the board 150 and subsequently sealed in a suitable plastic encapsulation in a manner to be discussed in greater detail below.

Referring now to FIG. 3, shown therein is a top plan view of the board 150 of FIGS. 1 and 2. The circuit board 150 is shown to comprise a plurality of head wire termination pads 168, to which the head wires (not shown) are bonded using a suitable soldering process once the circuit board 150 has been affixed to the flex 152. A total of 40 pads 168 are shown in FIG. 3; as MR heads each require the use of four connection paths, the board 150 will thus accommodate up to ten MR heads 118 (for five corresponding discs 108). Although not shown in FIG. 3, it will be recognized that the board 150 includes traces which provide electrical connection paths between the pads 168 and the preamplifier circuit 166, the traces running below a solder mask 170 forming the top layer of the board 150. As discussed above, the preamplifier circuit 166 comprises an integrated circuit 172 having leads which are wire bonded to corresponding pads 174, after which the integrated circuit 172 and the pads 174 are encapsulated utilizing a suitable epoxy (shown at 176). It will be readily understood that the integrated circuit 172 and pads 174 are not visible after encapsulation, but have been shown in FIG. 3 for purposes of clarity. As the pads 174 provide both input and output connections for the integrated circuit 172, the actual number of pads 174 and the layout thereof will be determined by the particular integrated circuit selected; for reference, one suitable integrated circuit 172 is a VTC VM61312 Magneto-Resistive Head Read/Write Preamplifier from VTC Inc., Bloomington Minn., USA, which provides both write current generation and read signal amplification operations. It will be appreciated by those skilled in the art that other types of integrated circuits can readily be used without departing from the scope and spirit of the present invention.

Additional discrete components 180 (such as capacitors and resistors) can further be provided on the board 150 as required for a particular application. A plurality of plated-through-holes (hereinafter also referred to as "PTHs" or "vias") are generally indicated at 182, the vias providing the necessary electrical interconnections between the top and bottom surfaces of the board 150.

FIG. 4 provides a generalized cross-sectional, elevational view of the board 150 in conjunction with a portion of the flex 152 of FIG. 1 (the signal paths encapsulated within the flex 152 have been omitted for purposes of clarity). In addition to the preamplifier circuit 166, discrete components 180 and the solder mask 170, FIG. 4 further shows the circuit board 150 to comprise a trace layer 184 running just below the solder mask 170, the trace layer comprising the individual electrical connection paths between the various components of the board 150. The trace layer 184 is supported upon a dielectric layer 186, the dielectric layer 186 comprising an epoxy mixed with interweaved, nonparticulating fibers. Although a particularly suitable interleaved epoxy is commercially available as part no. 77GS-9114 from W. L. Gore, Inc. with said epoxy having intermixed tetrafluoroethylene (TFE) fibers, it will be appreciated by those skilled in the art that other types of epoxy can readily be used without departing from the scope and spirit of the present invention.

The dielectric layer 186 is preferably selected to be from about 25 micrometers ($\mu$m) to 50 $\mu$m (0.0010" to 0.0020") in thickness to ensure adequate insulation and fill properties. The dielectric layer 186 is disposed over a conductive substrate 188 which preferably comprises a solid copper layer of from about 2.5 millimeters (mm) to 5.0 mm (0.0100" to 0.0200") in thickness. The substrate 188 serves as an electrical backplane for the board 150, provides structural support for the board 150 and, due to its relative thickness and heat conduction properties, serves as an efficient heatsink for the heat generated by the preamplifier circuit 166 during disc drive operation.

The underlying portions of the board 150 are similar in construction to the above discussed top portions in that a second dielectric layer 190 is disposed on the bottom surface of the substrate 188, a second trace layer 192 is run along the second dielectric layer 190 and a second solder mask 194 is disposed over the second trace layer 192. Although not explicitly shown in FIG. 4, it will be recognized that electrical connections are made between the annular rings disposed at the bottom of the PTHs 182 in the board 150 and corresponding connection points of the flex 152 at locations where the signal paths in the flex 152 are exposed for this purpose.

FIG. 5 provides a larger cross-sectional view of the board 150 of FIG. 4, illustrating in greater detail the various layers described in FIG. 4 with certain components from FIG. 4 omitted for purposes of clarity. Of particular interest in FIG. 5 is the PTH 182. As described more fully below, holes are drilled or etched at selected locations of the substrate 188 and the inside surfaces of the holes are coated with the interleaved epoxy used to form the first and second dielectric layers 186, 190. The PTHs 182 and the pads 168, 174 (FIG. 3) are subsequently plated with gold or other suitable material in an electroless plating or electroplating operation.

Having concluded a general discussion of the board 150, a first preferred methodology in which the board 150 is formed will now be discussed. Due to form factor requirements associated with modern disc drives, each of the boards 150 preferably measures about 17.6 mm×14.2 mm (0.695"× 0.560"). It has therefore been found advantageous to perform the various manufacturing steps on a panel 200 from which a plurality of the boards 150 can be subsequently detached.

To form the panel 200, with reference to FIG. 6 a copper plate 202 is initially provided having overall dimensions of about 20 centimeters (cm)×4.8 cm×2.5 cm (8.00"×1.90"× 0.01"). 20 of the boards 150 are thus formed from the copper plate 202, although it will be recognized that other sizes of panels can readily be used as desired. Preferred, alternative embodiments of panels will be discussed below.

To improve the ability to detach the finished boards 150 from the panel 200, grooves (such as identified at 204) are cut or etched into the plate 202, the grooves being nominally about 3.0 mm (0.12") in width and about 1.2 mm (0.050") in depth (or otherwise about half the thickness of the plate 202). Alternatively, the grooves 204 can be made to extend all the way through the plate 202. A suitable cutting instrument such as a rotary saw is preferably used later in the operation to cut out the finished boards 150; the grooves 204 are thus generally aligned along the paths the saw will take so as to minimize the amount of material cut, and hence the volume of particulates generated during the cutting of the plate 204 (it will be recalled that particulates are detrimental within the internal environment of the disc drive 100). A cross-sectional view of plate 202 showing the groove 204 cut to about half the thickness of the plate 202 is shown in FIG. 7 and is indicated by the line 7—7 in FIG. 6. It will be recognized that making the grooves 204 extend all the way through the plate 202 significantly reduces the amount of material that must be cut in order to excise the finished boards 150 from the panel, but potentially at the expense of reducing the structural rigidity of the panel during intermediate operations.

Referring now to FIG. 8, holes 206 are drilled or chemically etched into the plate 202 at locations where the vias 182 (FIG. 3) are desired, preferably during the same process used to form the grooves 204. Although any number and configuration of holes can be used, for purposes of clarity only two such holes 206 have been indicated in FIG. 6. Alignment holes 208, useful in mask registration and panel mounting, can also be formed at this time.

The top and bottom surfaces of the plate 202 and the interior surfaces of the holes 206, 208 are then coated with the interleaved epoxy to form the dielectric layers 186, 190. Particularly, in the preferred embodiment the interleaved epoxy is provided in sheets which are clamped to the plate 202. The sheets and the plate 202 are then heated in an oven at sufficient duration and temperature to cause reflow of the sheets to form the dielectric layers 186, 190. FIG. 9 shows a cross-sectional view of the plate 202 and the dielectric layers 186, 190 as indicated along line 9—9 of FIG. 8.

With reference now to FIG. 10, suitable masking and plating operations are performed to form the trace layers 184, 192 (FIG. 4). The solder masks 38,60 are then formed over the trace layers 184, 192 and recessed from the ultimate edges of the boards 150. An electroplating operation is next preferably performed to form the annular rings and inside plating of the vias 182 and the pads 168, 174, including the use of processes to provide suitable wire bondable layers on the pads 174.

The integrated circuits 172 are glued in place and wire bonded to the pads 174, preferably using an automated wire bonding process. The integrated circuits 172 and pads 174 are then encapsulated using suitable epoxy 176, such as part no. 4401 or 4451 (dam) and part no. 4450 (filler) supplied by Hysol, Inc., although as will be appreciated by those skilled in the art other types of encapsulation methodologies can be advantageously applied without departing from the scope and spirit of the present invention. A particularly advantageous manner in which to encapsulate the integrated circuits 174 is to run a bead around each circuit using the less viscous dam material and then fill in the volume within the bead using the more viscous filler material. Once cured the encapsulation will generally take the shape as indicated in FIG. 4. The discrete components 180 (FIG. 3) are then soldered to the board 150 and a cutting operation using a diamond saw is performed to cut the completed boards 150 from the panel. For reference, FIG. 11 provides a cross-sectional view of the panel as indicated by line 11—11 in FIG. 10.

Having concluded the discussion of the panel configuration of FIGS. 6–11, alternative preferred embodiments will now be discussed. Referring now to FIG. 12, shown therein is a panel 300 having 25 boards 150 generally fabricated in accordance with the foregoing discussion. Grooves 302 (whether extending completely through or only partially through the panel 300) are provided to facilitate the excision of the boards 150 from the panel 300. For reference, the panel 300 has overall dimensions of about 9.8 mm×9.8 mm×5 mm (3.8"×3.8"×0.020").

FIG. 13 provides another configuration for a panel 400, generally accommodating a total of 15 boards 150. The panel 400, however, includes grooves 402 that are significantly narrower than the grooves 204, 302 discussed above, but still having sufficient width to accommodate a suitable cutting instrument such as a diamond saw. The overall dimensions of the panel 400 are about 10.2 mm×5.1 mm×0.25 mm (4.00"×2.00"×0.01"). For reference, FIG. 14 shows the bottom side of the panel 400, including flex connection pads 404 oriented for connection with the flex 152.

FIG. 15 provides a general cross-sectional, elevational view of a board 150' having an alternative preferred construction to that of the board 150 discussed above. Particularly, in addition to the copper substrate 188, dielectric layers 186, 190, and solder mask layers 170, 194, the alternative board 150' additionally includes nickel layers 406, 408 deposited upon the substrate 188, each of the nickel layers 406, 408 having a thickness of about 150 $\mu$m (0.006"). Additionally, the board 150' is shown to have pads 168' which are similar in construction to the pads 168 discussed above, except that the pads 168' comprise a layer of palladium 410 about 30–50 $\mu$m (0.0012"–0.0020") thick over which a thin layer of gold 412 about 3–5 $\mu$m (0.00012"–0.00020") is disposed. Although not shown in FIG. 15, the pads used to connect the integrated circuits 172 to the board 150 are preferably formed in a similar fashion. The additional layers 406, 408, 410 and 412 enhance the manufacturability of the board 150' and are formed from conventional electroplating processes.

Referring now to FIG. 16, shown therein is yet another alternative embodiment for a panel 500, having boards 502 similar in construction to the boards 150, 150' discussed above, except that the boards 502 are provided with two preamplifier circuits 166 for disc drive configurations having a number of heads larger than the number of heads that a single preamplifier circuit 166 can accommodate. As shown in greater detail in FIG. 17, head wire pads 508 are arranged in a v-shaped layout to accommodate a corresponding large number of head wires from the heads. As discussed above, MR heads typically require the use of four head wires apiece; thus, the boards 502 can accommodate up to 80 head wires in a 10 disc, 20 head disc drive configuration.

FIGS. 18 and 19 provide top and bottom plan views, respectively, of the flex assembly 140 of FIG. 1. As shown in FIGS. 18 and 19, the flex connector 156 (FIG. 1) is connected to corresponding pads (not separately designated) of the flex 152 and is mechanically supported by a connector support plate 510 to which the flex 152 is attached. The termination bracket 154, also previously shown in FIG. 1, is affixed to a portion of the flex 152 as shown, the termination bracket 154 mechanically securing the flex 152 relative to the base deck 102 in a known manner.

FIGS. 18 and 19 further show the flex bracket 162 in greater detail. As previously discussed with reference to FIG. 2, the flex bracket 162 is supported by the support arm 158 of the actuator assembly 110 so as to secure the flex 152 relative to the board 150, as well as to facilitate attachment of the coil wires 164 to the flex 152. Finally, FIGS. 18 and 19 show a board support plate 512 which supports the board 150 and portions of the flex 152. The board support plate 512 also facilitates attachment of the board 150 to the actuator assembly 110 by way of board support plate flanges 514 which extend from the board support plate 512. Although not shown, for purposes of clarity openings are provided in the support plate flanges 514 through which hardware can be placed to secure the board support plate 512 to the actuator assembly 110. An elevational view of the board support plate 512 is provided in FIG. 20.

It will now be apparent that an important advantage associated with the present invention is the use of the conductive substrate 188 which provides mechanical support, heat conduction and backplane suppression for the circuit board 30. Although 2.5–5.0 mm (0.010"–0.020") has been identified as the preferred thickness range for the conductive substrate 188, other thicknesses can be used as long as acceptable backfill by the interweaved epoxy through the vias 182 is maintained. Further, although copper has been identified as being particularly useful as a material from which the substrate 188 can be formed, other similar conductive materials, including the use of additional layers may be found advantageous in certain applications.

Another important advantage is the nonparticulating characteristic of the circuit boards 150, 150', 502, which as will be recognized is desirable for devices located within the sealed interior of a disc drive, where particulate contamination of the disc surfaces can cause significant operational problems. Unlike conventional glass fibers, the low particulating characteristics of the interleaved epoxy with TFE fibers discussed above make this material particularly advantageous. Further, the recessing of the plates and solder masks away from the cutting locations on the various disclosed panels also contributes favorably to the low particulating characteristics of the boards.

Finally, although a diamond saw has been identified as the preferred cutting instrument for excising the circuit boards 30 from the panel, it is contemplated that other well known cutting instruments could be employed, including routing, punching and water jet cutting.

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. A circuit board designed for a disc drive flex assembly in a disc drive having a rotatable disc and heads controllably positionable with respect to the disc, the circuit board comprising:

a substrate comprising a substantially solid, electrically conductive material;

a dielectric layer disposed over the substrate, the dielectric layer comprising:
an epoxy; and
TFE fibers intermixed with or interleaved in the epoxy; and head wire connection pads disposed over the dielectric layer, the head wire connection pads facilitating electrical connection of head wires from the heads to the circuit board, the dielectric layer electrically insulating the head wire connection pads from the substrate, and the substrate providing mechanical support for the circuit board.

2. The circuit board of claim 1, further comprising:

circuitry connection pads disposed over the dielectric layer;

signal paths disposed over the dielectric layer, the signal paths connecting selected head wire connection pads with selected circuitry connection pads; and a preamplifier circuit, operably coupled to the circuitry connection pads, the preamplifier circuit responsive to signals transmitted along the head wires, the substrate sinking heat generated by the preamplifier circuit during operation of the preamplifier circuit.

3. The circuit board of claim 1, wherein the substrate comprises copper having a thickness of between 2.5 millimeters and 5.0 millimeters.

4. The circuit board of claim 1, wherein the TFE fibers of the dielectric layer are interleaved in the epoxy.

5. The circuit board of claim 2, wherein a plurality of the circuit boards are formed by a process characterized by:

(a) providing a plate of the substantially solid, electrically conductive material, the plate having length and width dimensions greater than length and width dimensions of the circuit board;

(b) forming grooves in the plate at locations corresponding to boundaries of the plurality of the circuit boards;

(c) applying a layer of the epoxy and the TFE fibers to the plate;

(d) forming the head connection pads, the signal paths and the circuitry connection pads on the layer of the epoxy and the TFE fibers at locations on the plate corresponding to the plurality of the circuit boards;

(e) attaching the preamplifier circuits to the circuitry connection pads; and (f) excising the plurality of the circuit boards from the plate by cutting the plate along the grooves.

6. A circuit board designed for use within the interior environment of a disc drive, the circuit board comprising:

a substrate comprising a conductive material, the substrate having length and width dimensions corresponding to length and width dimensions of the circuit board, the substrate further having a top surface, a bottom surface and a thickness sufficient to provide mechanical support for the circuit board;

a dielectric layer disposed over the top surface of the conductive substrate, the dielectric layer comprising an insulating epoxy having TFE fibers interleaved therein or intermixed therewith;

electrical signal paths disposed over the dielectric layer;

a solder mask disposed over the electrical conduction paths, the solder mask having selected length and width dimensions substantially corresponding to the length and width dimensions of the circuit board;

head wire pads disposed along a selected edge of the circuit board, each head wire pad connected to a selected one of the electrical signal paths; and a preamplifier circuit electrically connected to selected ones of the electrical conduction paths, the conductive substrate sinking heat generated by the preamplifier circuit during operation of the preamplifier circuit.

7. The circuit board of claim 6, wherein the conductive material of the substrate comprises copper having a thickness of from about 2.5 millimeters to 5.0 millimeters.

8. The circuit board of claim 6, wherein the TFE fibers of the dielectric layer are interleaved in the epoxy.

9. The circuit board of claim 6, wherein the preamplifier circuit is encapsulated in epoxy.

10. The circuit board of claim 6, wherein the circuit board can be affixed to a flex comprising a laminated plastic ribbon with encapsulated signal paths, and wherein the circuit board further comprises:

a second dielectric layer formed on the bottom surface of the substrate, the second dielectric layer comprising an insulating epoxy having TFE fibers interleaved therein or intermixed therewith;

second electrical signal paths disposed on the second dielectric layer;

a second solder mask disposed over the second electrical conduction paths, the second solder mask having selected length and width dimensions substantially corresponding to the length and width dimensions of the circuit board;

plated through holes extending through the substrate and electrically insulated from the substrate, the plated through holes connecting selected ones of the electrical signal paths and the second electrical signal paths, the plated through holes facilitating electrical connection of the circuit board to the flex when the flex is disposed adjacent the second solder mask.

11. The circuit board of claim 10, wherein a plurality of the circuit boards are concurrently formed in a panel from which the circuit boards can be excised by a process characterized by:

(a) providing a plate of the conductive material having length and width dimensions greater than the length and width dimensions of one of the circuit boards, the plate having a thickness corresponding to the thickness of the substrate of one of the circuit boards, the plate comprising a top surface and a bottom surface;

(b) forming connection holes in the plate at selected locations corresponding to desired locations for the plated through holes of the circuit boards;

(c) providing grooves in the plate at locations generally corresponding to edges of the circuit boards;

(d) coating the top and bottom surfaces of the plate with the insulating epoxy to form the dielectric layers and the second dielectric layers of the circuit boards, the insulating epoxy coating the inner surfaces of the connection holes;

(e) forming the electrical conduction paths and the second electrical conduction paths;

(f) applying solder mask material to form the solder masks and the second solder masks;

(g) selectively plating the panel to form the head wire pads and the plated through holes;

h) connecting the preamplifier circuits for the circuit boards; and (i) using a cutting instrument to cut the circuit boards from the panel.

12. The circuit board as claimed in claim 11, wherein step (c) is further characterized by:

(c)(1) forming the grooves so that the grooves extend completely through the plate.

13. The circuit board as claimed in claim 11, wherein step (c) is further characterized by:

(c)(1) forming the grooves so that the grooves extend into the plate a distance less than the thickness of the plate.

14. The circuit board as claimed in claim 11, wherein step (f) is further characterized by:

(f)(1) recessing the solder mask material with respect to the grooves in the plate.

15. A method for forming a circuit board designed for use in a disc drive flex assembly, having circuit board housing preamplifier circuitry used to amplify read signals generated by a head electrically connectable to the circuit board by way of head wires, the circuit board having selected overall length and width dimensions, the method comprising the steps of:

(a) providing a plate of conductive material having length and width dimensions sufficient to accommodate a plurality of adjacently placed circuit boards, the plate having a thickness corresponding to a thickness of a substrate of one of the circuit boards, the plate comprising a top surface and a bottom surface;

(b) forming connection holes in the plate at selected locations corresponding to desired locations of plated through holes of the circuit boards;

(c) forming grooves in the plate at locations corresponding to edges of the circuit boards;

(d) coating the top and bottom surfaces of the plate with insulating epoxy to form dielectric layers for the circuit boards, the dielectric layers providing electrical insulation for the substrates of the circuit boards, the insulating epoxy having TFE fibers interleaved therein or intermixed therewith, the insulating epoxy coating the inner surfaces of the connection holes;

(e) forming electrical conduction paths on the dielectric layers of the circuit boards;

(f) applying solder mask material to the plate to form solder masks over the electrical conduction paths of the circuit boards;

(g) selectively plating the plate to form head wire pads and the plated connection holes, the head wire pads connected to selected ones of the electrical connection paths and connectable to the head wires;

(h) connecting circuitry to selected electrical connection paths; and (i) excising the circuit boards from the plate by cutting the plate with a cutting instrument along the grooves in the plate.

16. The method of claim 15, wherein the conductive material comprises copper having a thickness of from about 2.5 millimeters to 5.0 millimeters.

17. The method of claim 15, wherein the TFE fibers are interleaved in the epoxy.

18. The method of claim 15, wherein step (f) is further characterized by:

(f)(1) limiting the application of the solder mask material to portions of the plate substantially corresponding to the length and width dimensions of the circuit boards, the solder mask material being recessed from the grooves so that the solder mask material is not cut by the cutting instrument when the circuit boards are cut from the plate.

19. The method of claim 15, wherein step (c) is further characterized by:

(c)(1) forming the grooves so that the grooves extend completely through the plate.

20. The method of claim 15, wherein step (c) is further characterized by:

(c)(1) forming the grooves so that the grooves extend into the plate a distance less than the thickness of the plate.

* * * * *